United States Patent [19]

Lowitz

[11] Patent Number: 4,942,363

[45] Date of Patent: Jul. 17, 1990

[54] APPARATUS AND METHOD FOR MEASURING TWO PROPERTIES OF AN OBJECT USING SCATTERED ELECTROMAGNETIC RADIATION

[75] Inventor: David A. Lowitz, Richmond, Va.

[73] Assignee: Philip Morris Incorporated, New York, N.Y.

[21] Appl. No.: 342,872

[22] Filed: Apr. 25, 1989

[51] Int. Cl.[5] .......... G01R 27/04

[52] U.S. Cl. .......... 324/631; 324/638; 324/632; 324/643; 324/634; 131/905

[58] Field of Search .......... 131/905, 906, 908; 324/631, 638, 632, 643, 634

[56] References Cited

U.S. PATENT DOCUMENTS

| | | | |
|---|---|---|---|
| 3,103,627 | 9/1963 | Schneider | 324/631 |
| 4,350,170 | 9/1982 | Baier | 131/906 |
| 4,616,139 | 10/1986 | Heitmann | 131/905 |
| 4,707,652 | 11/1987 | Lowitz . | |
| 4,727,311 | 2/1988 | Walker . | |
| 4,766,910 | 8/1988 | Okumoto | 131/905 |
| 4,789,820 | 12/1988 | Parrent, Jr. et al. . | |
| 4,805,641 | 2/1989 | Radzio | 131/905 |
| 4,836,221 | 6/1989 | Okumoto | 131/905 |

OTHER PUBLICATIONS

S. Nakayama, "Simultaneous Measurement of Basis Weight and Moisture Content of Sheet Materials by Microwave Cavity", Japanese Journal of Applied Physics, vol. 26, No. 7, Jul. 1987, pp. 1198–99.

*Primary Examiner*—Reinhard J. Eisenzopf
*Assistant Examiner*—Jose M. Solis
*Attorney, Agent, or Firm*—Jeffrey H. Ingerman

[57] ABSTRACT

A method and apparatus for monitoring two components of an object, such as moisture content and density in a tobacco rod, using scattered electromagnetic radiation are provided. The invention relies on the fact that both the real imaginary parts of the dielectric constant of water vary greatly over frequencies in the gigahertz region while those of the remaining constitutents of tobacco do not, and particularly on the fact that, at frequencies approaching 100 GHz, the real part of the dielectric constant of water is much closer to that of many organic polymers, such as those making up tobacco, than it is at lower frequencies, and the imaginary part of the dielectric constant of water is much lower at frequencies approaching 100 GHz than it is in the region of 20 to 30 GHz. By comparing the scattering of electromagnetic radiation by the object—i.e., the cigarette rod—at two different frequencies and using a predetermined calibration curve based on a cigarette rod having a desired moisture content and density, one can determine the moisutre content and density of the cigarette rod. If the monitoring is taking place on a cigarette making machine and the moisture content and density deviate from their desired values, the machine feeds can be adjusted automatically to restore the desired moisture content and density.

35 Claims, 6 Drawing Sheets

APPARATUS AND METHOD FOR MEASURING TWO PROPERTIES OF AN OBJECT USING SCATTERED ELECTROMAGNETIC RADIATION

BACKGROUND OF THE INVENTION

This invention relates to devices for measuring two properties of an object, such as water content and density. In particular, this invention relates to such detectors using scattered electromagnetic radiation at scattering angle greater than zero degree. More particularly, this invention relates to the use of two frequencies to measure two properties of an object, with the two frequencies selected in such a manner that at one frequency both the real and imaginary parts of the dielectric constants of components of the object that are of interest are quite different, whereas at the other frequency, at least one of the real and imaginary parts of the dielectric constants of the components of the object that are of interest are relatively close in value; the complex dielectric constant of one of the object's relevant components is fairly constant for the two frequencies. This invention is particularly directed to monitoring objects that do not strongly attenuate electromagnetic radiation.

It is known that the change in the angular scattering spectrum of an object from its expected angular scattering spectrum at a particular frequency of electromagnetic radiation can be used as an indication that impurities are present in the object. U.S. Pat. No. 4,707,652, which is hereby incorporated by reference in its entirety, shows such a device, and in particular discusses its use to detect impurities in cigarettes during manufacture. However, such a device can only determine that some aspect of the object deviates from the expected norm, but cannot isolate changes in individual components of the object unless additional information is available from other sources.

In the manufacture of cigarettes, for example, it is desirable not only to be able to detect the presence of impurities in the tobacco rod being formed on a cigarette making machine, but also to be able to measure cigarette density and moisture content and particularly variation from normality during manufacture. Currently, two separate measurements using different types of monitors are needed to determine density and moisture content of the tobacco rod. Generally, the density measurement is made by beta ray attenuation.

It would be desirable to be able to provide apparatus for monitoring two components of an object simultaneously using electromagnetic radiation.

It also would be desirable to be able to provide such apparatus for objects which attenuate electromagnetic radiation by a small amount.

It further would be desirable to be able to provide such apparatus which does not use radioactive materials.

SUMMARY OF THE INVENTION

It is an object of this invention to provide apparatus for monitoring two components of an object simultaneously using electromagnetic radiation.

It is also an object of this invention to provide such apparatus for objects which attenuate electromagnetic radiation by a small amount.

It is a further object of this invention to provide such apparatus which does not use radioactive materials.

In accordance with this invention, there is provided apparatus for monitoring at least two components of an object, each of the components contributing to the dielectric constant of the object. The contribution of one of the components to the dielectric constant should vary substantially, relative to that of the other component, over a selected frequency range and the contribution of the other component should be relatively constant over the selected frequency range. The apparatus includes a source of electromagnetic radiation for directing a beam of electromagnetic radiation linearly polarized in a predetermined direction along a predetermined line of incidence toward the object, the beam of electromagnetic radiation comprising at least two frequency components within the selected frequency range.

The object scatters the beam of radiation through reflection, interference and refraction as a function of scattering angle. The intensity of scattered radiation polarized in a direction parallel to said predetermined direction forms an angular scattering intensity spectrum for each of the frequency components, each of the spectra varying between localized maxima and minima as a function of scattering angle.

The apparatus further comprises at least one radiation detection means selectively sensitive to said at least two frequency components for generating signals relating to the intensity of radiation scattered from the object at each of the frequency components and polarized only in a direction parallel to the predetermined direction. The signals are characteristic of the angular scattering intensity spectra, such that the radiation detection means would generate known intensity signals if the components of the object were present at predetermined levels. The radiation detection means generates signals having intensities differing from the known intensities when the components of the object differ from the predetermined levels. A means for indicating the levels of the components in the object is connected to the radiation detection means, wherein the indicating means responds to the differing intensity signal for each of the frequency components and to relative amounts by which each of the differing intensity signals differs from its corresponding known intensity signal, thereby indicating the deviation of the level of each of the components from each corresponding predetermined level.

A method for monitoring two components of an object is also provided.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

Figure 1:
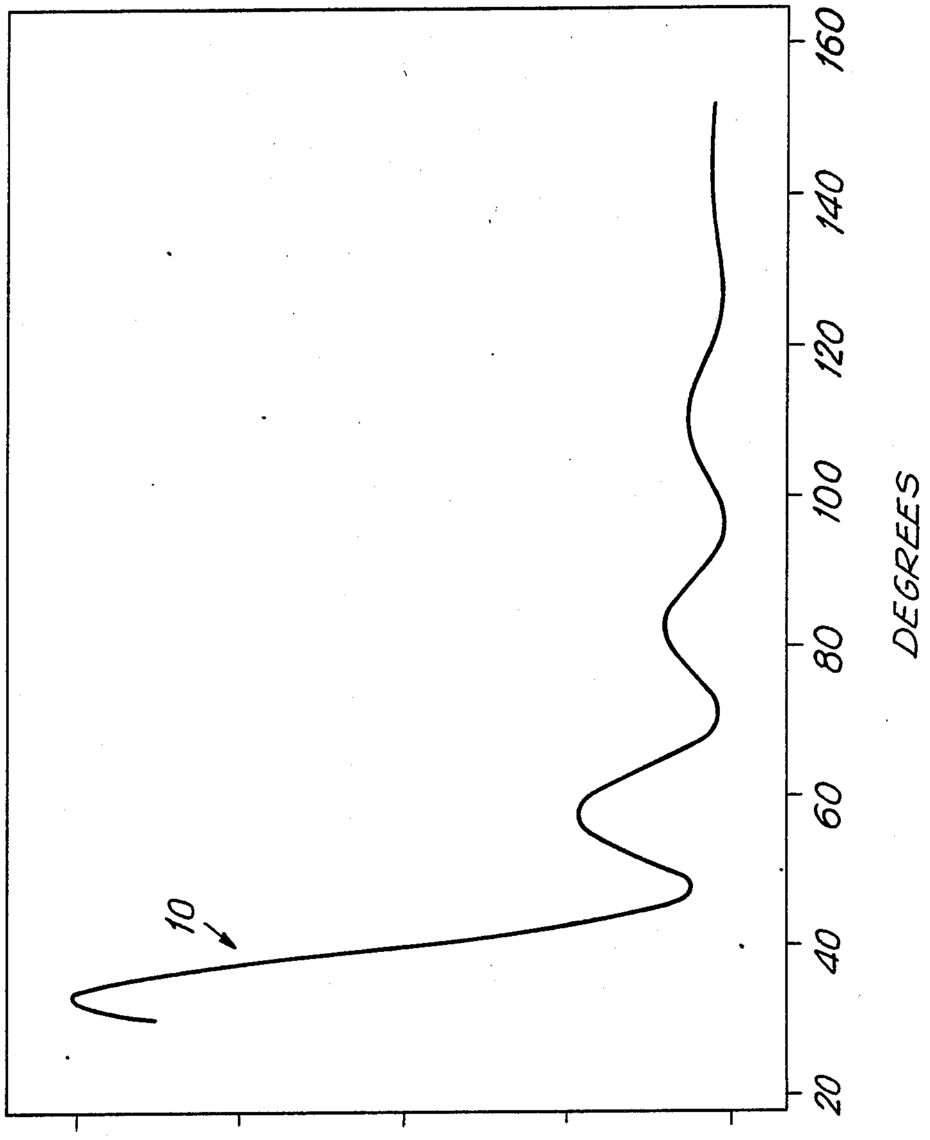
FIG. 1 is a graph showing the angular scattering spectrum of a conventional, commercially available cigarette.
Figure 5:
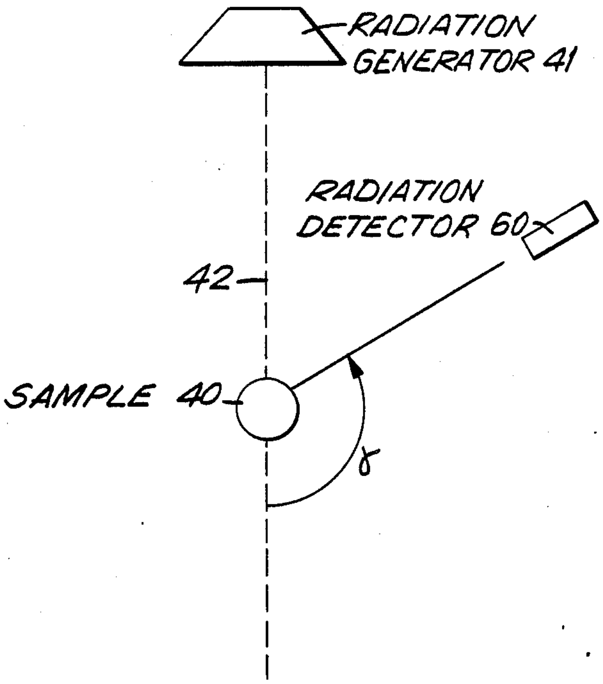
FIG. 5 is a schematic representation of an alternative detector arrangement according to the present invention for measuring the density and moisture content of cigarette rods.

The present invention is based on the fact that solid objects will scatter electromagnetic radiation, producing an angular scattering spectrum having maxima and minima at different scattering angles. FIG. 1 shows such a measured angular scattering spectrum 10 at 89.7797 GHz for a commercially available cigarette, with the scattering angle defined as shown in FIG. 5 and with normalized amplitude. These data are for the case of a plane wave polarized parallel to the long axis of the cigarette which, relative to the sample, can be referred to as the TH mode. Similar effects can also be obtained with other polarization modes such as the analogous TE mode. The scattered radiation being detected is only that having the same polarization as the radiation incident on the sample.

The scattering spectrum is determined in part by the shape of the object and its index of refraction. The index of refraction is the square root of the dielectric constant. In above-incorporated U.S. Pat. No. 4,707,652, it is disclosed that by selecting an angular position in a spectrum like that of FIG. 1, and then monitoring the deviation in amplitude at that angular position from the expected amplitude, the presence of impurities can be detected from such amplitude deviations. Such detection relies on bulk changes in the index of refraction, resulting at least in part from bulk changes in the dielectric constant.

Bulk changes in the dielectric constant result in changing contributions from different components of the object, each of which can have its own distinct dielectric constant. In accordance with the present invention, those changing contributions can be measured for some components of the object. In particular, by using two different frequencies of electromagnetic radiation, it may be possible to measure the amounts of two different components in an object, provided that the dielectric constant of one of those components is dependent on frequency, while the dielectric constant of the other component is relatively independent of frequency, and that the dielectric constants of the two components are almost the same at one of the frequencies.

A cigarette rod is made up of air, organic polymers, salts and water. The air has a dielectric constant of approximately 1.0 over the range of 0 to 100 GHz. The organic polymers and salts have a dielectric constant which is approximately 4.0 for a fairly large frequency range. Water, on the other hand, has a complex dielectric constant which varies greatly with frequency in a frequency range where the other components of tobacco have a fairly constant dielectric constant. The real part of the dielectric constant of water varies from about 80.0 to about 8.0 over the range of 0 to 100 GHz, and the imaginary part has a maximum of about 40.0 at 20 GHz but is small below 100 MHz and near 100 GHz. Because of the large changes in the dielectric constant of water as opposed to the dielectric constant of the remainder of a cigarette rod over the frequency range of from 15 GHz to 100 GHz, simultaneous measurement of scattering intensities at two frequencies respectively near the upper and lower bounds of that range can be used to monitor deviation from the norm of moisture content and density of a cigarette rod. According to the preferred embodiment of this invention, deviation from the norm of the moisture content and density of a cigarette rod on a cigarette making machine can be determined by using electromagnetic radiation at about 25 GHz and about 100 GHz.

Figure 2:
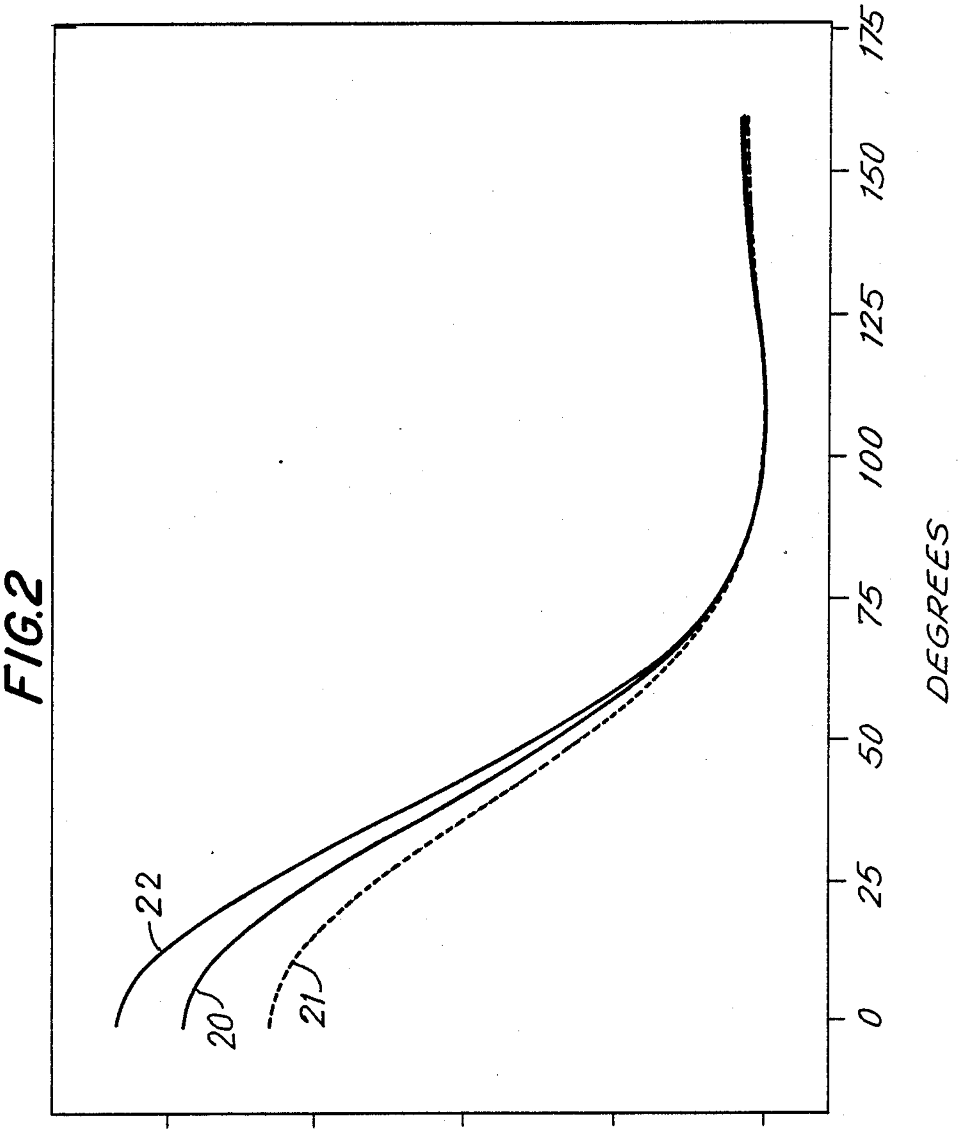
FIG. 2 is a graph showing the angular scattering spectrum at a first frequency of cigarette rods having different densities and moisture contents.
Figure 2A:
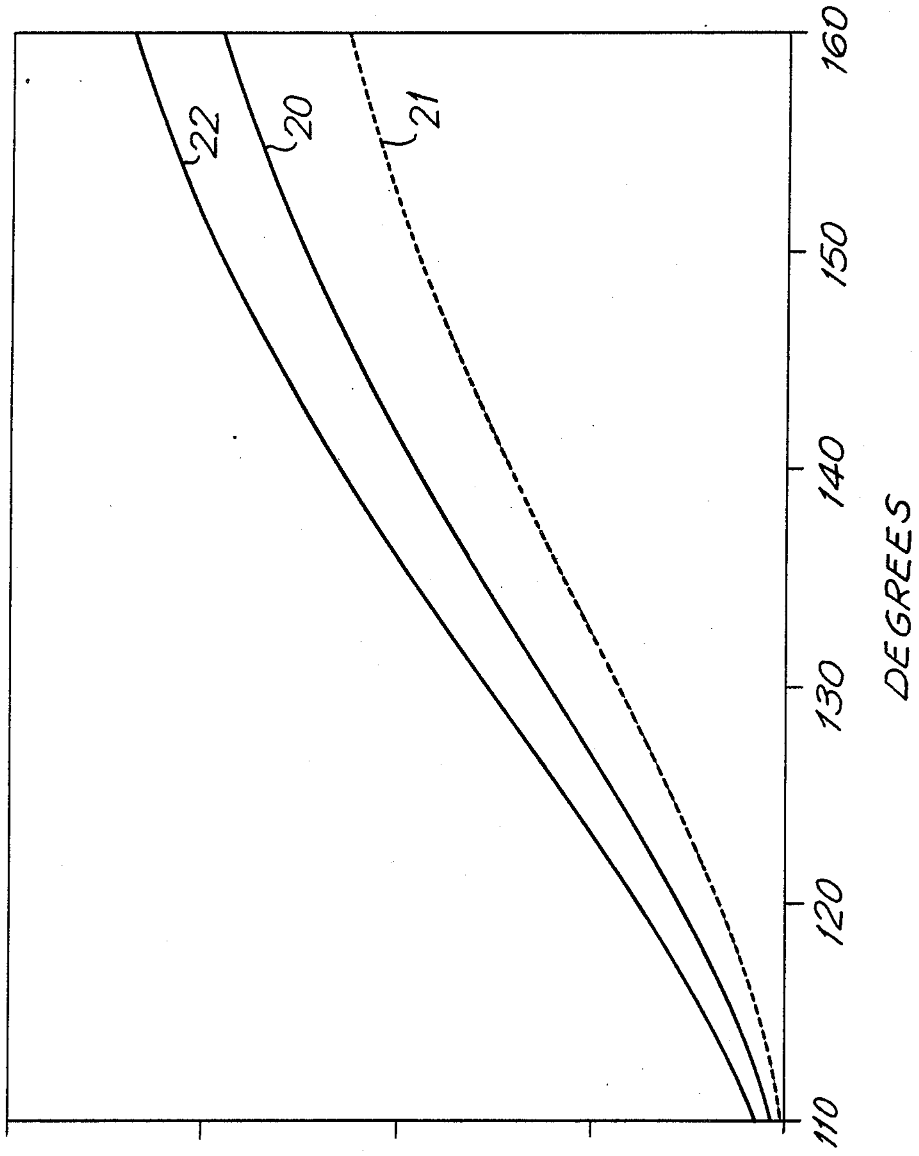
FIG. 2A is an enlargement of part of the graph of FIG. 2.

FIG. 2 shows the normalized angular scattering spectra for three different cigarette rods at 25 GHz. Spectrum 20 is a normalized angular scattering spectrum for a tobacco rod with tobacco moisture level at 25% by weight, and with dry tobacco content at a level such that the rod density would be 0.18 g/cm$^3$ if the moisture level were 12.7% by weight. Spectrum 22 a is normalized angular scattering spectrum for the same basic tobacco rod, but at an elevated moisture level of 27% by weight. Spectrum 21 is for a similar tobacco rod at 25% moisture by weight, but with dry tobacco content at a level such that the rod density would be 0.16 g/cm$^3$ if the moisture level were 12.7% by weight. FIG. 2A shows an enlargement of FIG. 2 between 110 degrees and 160 degrees. As can be seen, while the three spectra in FIG. 2 appear to almost coincide in this angular region, on amplifying this angular region, the signal-to-noise ratio for the separation between the spectra is still very good. This means that a large range of angles is available, allowing one to place monitoring devices on a cigarette making machine where the machine configuration allows. In general while the three spectra nearly coincide at certain angles, there is significant separation between them at many angles, which would therefore be useful angles at which to take measurements.

Figure 3:
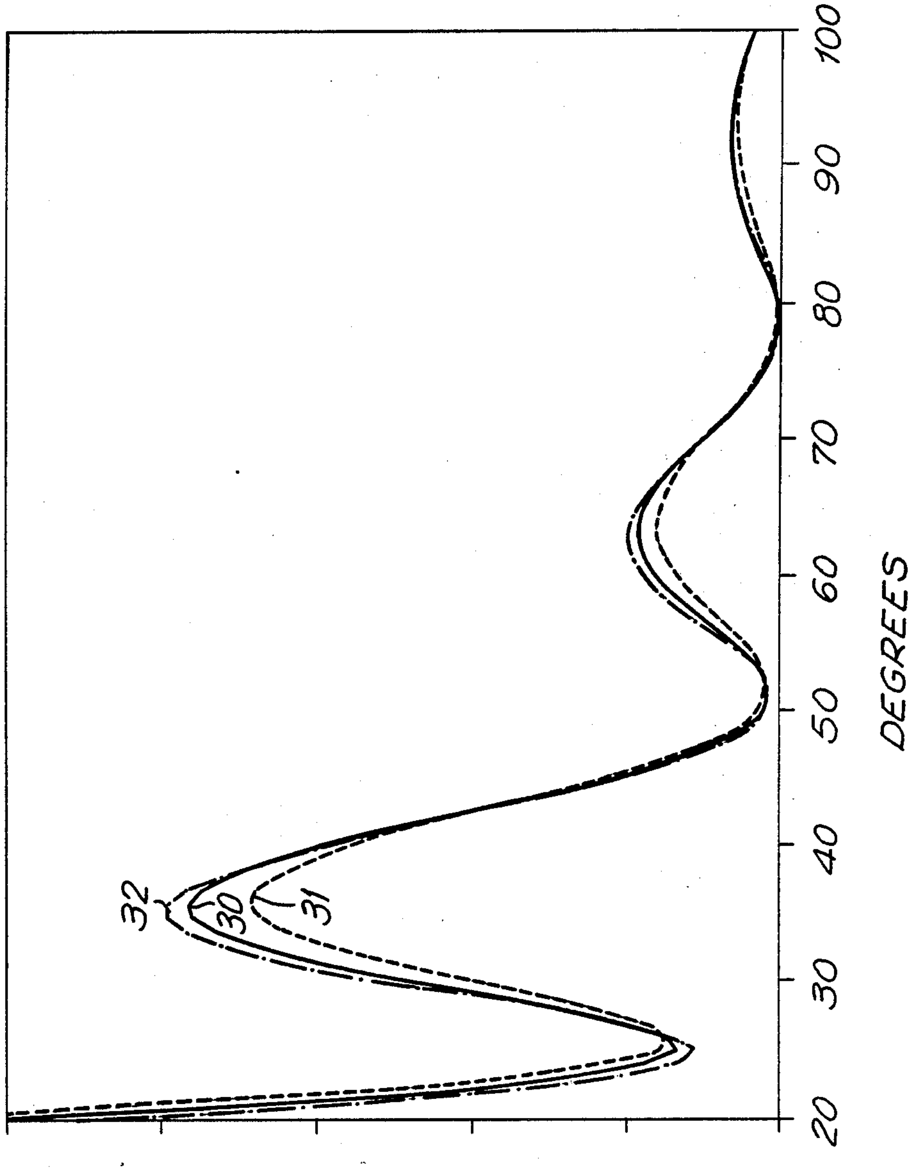
FIG. 3 is a graph showing the angular scattering spectrum at a second frequency of cigarette rods having different densities and moisture contents.

FIG. 3 shows normalized angular scattering spectra for the same three cigarette rods at 89.7797 GHz. Spectra 30, 31, 32 correspond to spectra 20, 21, 22. These spectra also have significant separation at certain angles, although the angles of maximum separation are not the same as at 25 GHz. Significantly, however, at 89.7797 GHz the separation in the spectra 30 and 32, caused by a change in moisture level, is much less than the separation between 30 and 31 due to an overall change in rod density, whereas for the same changes in density and moisture level the respective separation between the spectra at 25 GHz were almost the same as each other.

Figure 4:
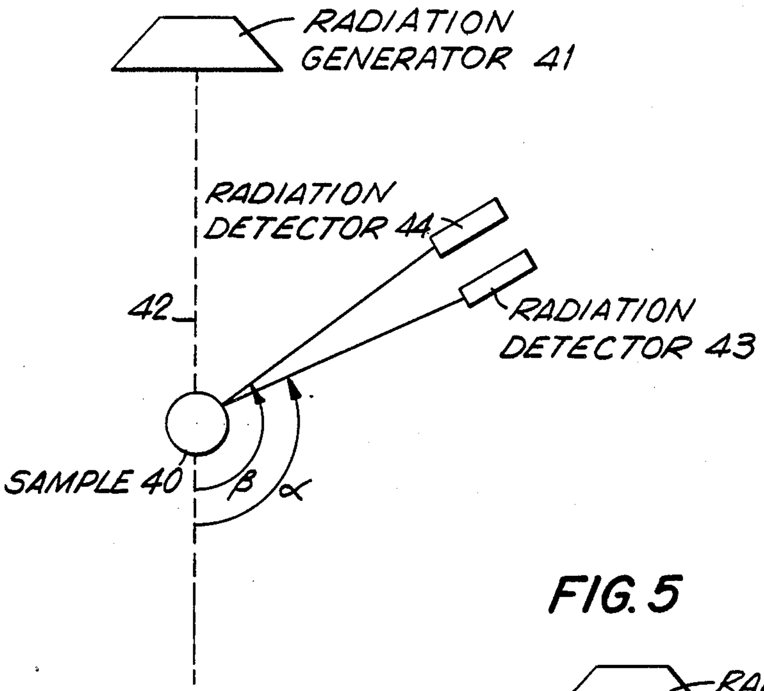
FIG. 4 is a schematic representation of a detector arrangement according to the present invention for measuring the density and moisture content of cigarette rods.

In one preferred embodiment of the present invention, illustrated in FIG. 4, cigarette rod 40 is illuminated with electromagnetic radiation at a first frequency of about 25 GHz and a second frequency of about 100 GHz from radiation generator 41, which is capable of generating two different wavelengths. Alternatively, two separate generators, one for each frequency, could be provided. The electromagnetic radiation is propagated toward sample 40 along line 42. The spectral curves of FIGS. 2, 2A and 3 are used to select monitoring angles $\alpha$, $\beta$ at which radiation detectors 43, 44, one of which is tuned to the first frequency and one of which is tuned to the second frequency, are located. Preferably, the detectors are positioned at or near extrema—maxima or minima—of the scattering spectra for greater sensitivity, but when the sample is a cigarette rod on a cigarette making machine, angles $\alpha$, $\beta$ are also determined in part based on where on the machine there is room to mount detectors 43, 44.

It is also possible to mount a single detector 50, capable of selectively receiving both frequencies, at an angle $\gamma$, as shown in FIG. 5. Angle $\gamma$ is chosen by comparing FIGS. 2 and 3 and selecting an angle at which the spectral separation between the various samples may not be maximum for one or both frequencies, but at which there is measurable separation for both frequencies. Again, the physical limitations of the cigarette making machine must be taken into account. The two different monitoring frequencies may then be modulated, each with a distinctive modulating frequency, e.g., 1 kHz and 2 kHz, respectively, and then the detector may feed two lock-in analyzers, respectively tuned to the two frequencies. This may be an optional configuration where machine space is limited. Further, for better accuracy one may monitor changes in the angular scattering spectrum at three or more frequencies rather than just two.

One manner in which the invention may be used is as follows. For a cigarette rod of normal cigarette length and of normal density and moisture content, the angular scattering spectrum is determined over the range of 20° to 60° for both the selected low and high frequencies in the case of a two-frequency configuration. Next, for several cigarettes of equal geometry, but with, in one case, normal density and several different moisture values, and, in another case, normal moisture but several different density values, angular spectra are obtained for the same angular ranges and for the same frequencies. These data are examined to determine the most suitable angle for placing the detectors, i.e., determining angles $\alpha$, $\beta$, or, if so desired, $\gamma$. The angle is chosen by noting the angle at which the maximum change in spectral amplitude occurs for a change in density and moisture level, and also the angle that will be allowed by the configuration of the machine on which the product is manufactured. For this particular mode of operation, one may then determine the end points of a calibration curve that is designed to determine the fraction of the change in cigarette properties due to a change in moisture and the fraction of the change that is due to a change in density. Therefore, one may plot fractions of change in properties due to change in moisture and fractions of change due to density as a function of a parameter R:

$$R=(\Delta P)_{HF}/[(\Delta P)_{HF}+(\Delta P)_{LF}]$$

where $(\Delta P)_{HF}$ is the percentage change from normal intensity at the high frequency angle and $(\Delta P)_{LF}$ is the percentage change from normal intensity at the low frequency angle.

Figures 6, 7:
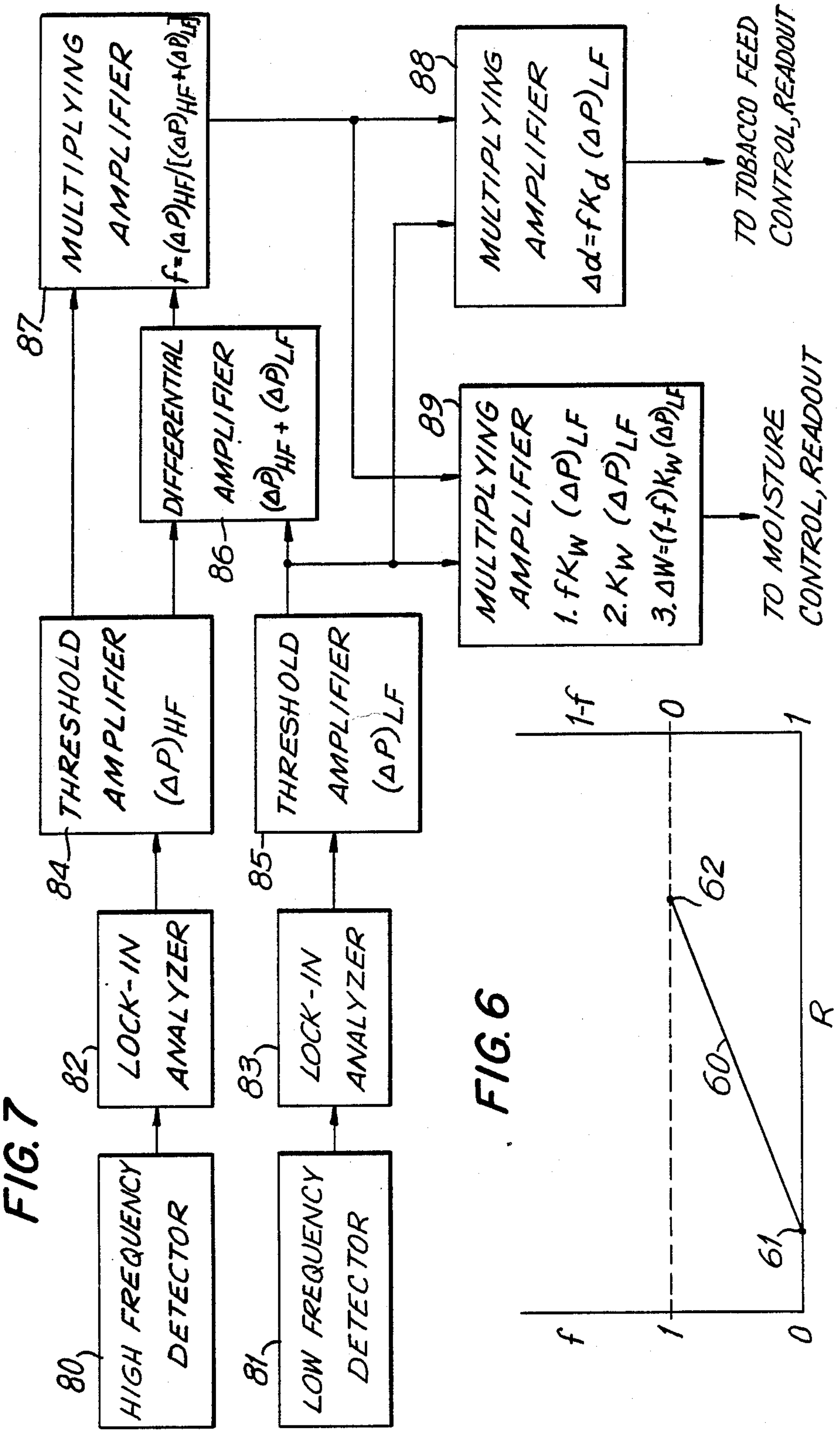
FIG. 6 is a graph showing a calibration curve for use with the present invention.
FIG. 7 is a block diagram of apparatus according to the invention.

The curve 60 in FIG. 6 illustrates the special case of a linear relationship where f is the fraction of total change due to change in density and $1-f$ is the fraction of total change due to change in moisture content. Point 61 represents the case where the change in the properties of the product is solely due to a change in the moisture content of the product, and point 62 represents the case where the change in the properties of the product is solely due to a change in the density of the product. Reading the value of R on the horizontal axis, the vertical axis on the left shows f, the fraction of the percentage change in intensity due to changes in density, while the vertical axis on the right shows $(1-f)$, the fraction of the percentage change in intensity due to changes in moisture content. Thus, for a given value of R, one can read f and $(1-f)$ and determine the percentage deviation of density and moisture content from their nominal levels.

Because such a curve generally would not be linear, however, it is in many cases preferable to obtain R values for cigarettes with several different but known levels of both density deviation and moisture deviation combined in the same cigarettes in order to construct a more general calibration curve. The measured intensity variation at the selected detector angles, for the case of density at constant moisture level, and for the case of moisture content at constant density level, may be used to obtain estimations of the actual density change, moisture level change, or both, for samples measured subsequently. At one of the selected frequencies, using the data for density change at constant moisture level, the density change for the sample is approximately:

$$(\Delta d)=fK_d(\Delta P)_d$$

where $(\Delta d)$ is the density change, f is the value obtained from the partitioning calibration curve, $(\Delta P)_d$ is the percentage change from normal of the intensity of the angular scattering spectrum at the selected angle and frequenqcy, and $K_d$ is a calibration constant derived from the data for scattering angle as a function of density at the selected angle and frequency. In an analogous manner:

$$(\Delta w)=(1-f)K_w(\Delta P)_w$$

where $\Delta w$ is the change in moisture content, f is obtained as described above, $(\Delta P)_w$ is the percentage change from normal of the intensity of the angular scattering spectrum at the selected angle and frequency, and $K_w$ is a calibration constant derived from the data for scattering angle as a function of moisture level at the selected angle and frequency.

In practice, the outputs of detectors 80 and 81 in FIG. 7, at the different frequencies and angles, would be input to lock-in analyzers 82, 83, respectively, for the high frequency (HF) radiation and for the low frequency (LF) radiation. The outputs of lock-in analyzers 82, 83 in turn, are input to thresholded amplifiers 84, 85 which are designed to yield the percentage change $(\Delta P)_{HF}$, $(\Delta P)_{LF}$ at the specified detector angles, $\alpha$ and $\beta$, or just $\gamma$, of the measured intensity of the preselected high frequency and low frequency components of the scattered radiation from the normal intensity. Appropriately biased differential amplifier 86 then provides $(\Delta P)_{HF}+(\Delta P)_{LF}$. The outputs of amplifiers 84, 86 are input to a multiplying amplifier 87 to obtain $(\Delta P)_{HF}/[(\Delta P)_{HF}+(\Delta P)_{LF}]$, which is f. The outputs of amplifiers 85, 87 are input to multiplying amplifier 88, which provides $fK_d(\Delta P)_{LF}$, which is $\Delta d$, the change in density. The outputs of amplifiers 85, 87 are also input to multiplying amplifier 89, which provides $fK_w(\Delta P)_{LF}$, $K_w(\Delta P)_{LF}$, and $(1-f)K_w(\Delta P)_{LF}$, which is $\Delta w$, the change in moisture content. The outputs of amplifiers 88, 89 can also be input to display devices, computers, or control valves designed to control the rate of tobacco feed to a cigarette rod and the moisture level in the tobacco on a cigarette mâking machine.

It should be noted that many other configurations are feasible depending on the type of product being monitored and the configuration of the machine. Similarly, frequencies other than 25 GHz and 89.7797 GHz may be used. In some cases it may be desirable to monitor at least one of the frequencies with two detectors placed, respectively, on each side of a peak in the expected angular scattering spectrum to determine whether a change in the object being monitored caused the peak to shift to a higher or lower scattering angle, as well as whether the change caused the peak to increase or decrease in magnitude. A change in the imaginary part of the complex index of refraction primarily causes the peak, at scattering angles greater than zero, to increase or decrease in magnitude, while a change in the real part of the complex index of refraction causes a peak, at scattering angles other than zero, to shift to higher or lower scattering angles as well as to increase or decrease in magnitude. Another approach for certain types of objects to be monitored may be to monitor one of the frequencies at more than one peak.

As stated above, the present invention can be used to monitor other characteristics or properties of cigarettes or other objects by scattering of electromagnetic radiation, provided that the components of the dielectric constant of the object contributed by the different characteristics being monitored vary differently as a function of frequency, and are almost the same at one of the monitoring frequencies.

The present invention is particularly suited to monitoring materials of low density or low dielectric constant because it uses non-zero angle scattering. In the case of zero angle (straight through) scattering, such materials transmit substantially all incident energy and small changes are difficult to detect. However, with non-zero angle scattering the signal-to-noise ratio for such materials is substantially the same as for other materials.

Thus it is seen that a method and apparatus are provided for monitoring two components of an object simultaneously using electromagnetic radiation. One skilled in the art will appreciate that the present invention can be practiced by other than the described embodiments, which are presented for purposes of illustration and not of limitation, and the present invention is limited only by the claims which follow.

What is claimed is:

1. Apparatus for monitoring two components of an object, said object having a dielectric constant, each of said components contributing to said dielectric constant, the contribution of one of said components to said dielectric constant substantially varying over a selected frequency range and the contribution of the other of said components being substantially constant over said selected frequency range, said apparatus comprising:

a source of electromagnetic radiation for directing a beam of electromagnetic radiation linearly polarized in a predetermined direction along a predetermined line of incidence toward said object, said beam of electromagnetic radiation comprising at least two frequency components within said selected frequency range; wherein:

said object scatters said beam of radiation through reflection, interference and refraction as a function of scattering angle, the intensity of scattered radiation forming an angular scattering intensity spectrum for each of said frequency components, each of said spectra varying between localized maxima and minima as a function of scattering angle; said apparatus further comprising:

at least one radiation detection means sensitive to said at least two frequency components for generating signals relating to the intensity of radiation scattered from said object at each of said frequency components and polarized only in a direction parallel to said predetermined direction, said signals being characteristic of said angular scattering intensity spectra for radiation polarized in said predetermined direction at said frequencies, such that said radiation detection means would generate known intensity signals if said components of said object were present at predetermined levels, said radiation detection means generating signals having intensities differing from said known intensities when said components of said object differ from said predetermined levels; and means for indicating the levels of said components in said object, said means for indicating being responsive to said radiation detection means, wherein said means for indicating responds to said differing intensity signal for each of said frequency components and to relative amounts by which each of said differing intensity signals differs from its corresponding known intensity signal, thereby indicating the deviation of the level of each of said components of said object from each corresponding predetermined level, thereby providing the levels of said components of said object.

2. The apparatus of claim 1, wherein said beam of electromagnetic radiation comprises two frequency components.

3. The apparatus of claim 1 wherein said source of electromagnetic radiation comprises a number of generators of electromagnetic radiation corresponding to said number of frequency components.

4. The apparatus of claim 1 wherein said source of electromagnetic radiation comprises a single generator of said number of frequency components.

5. The apparatus of claim 1 wherein said at least one radiation detection means comprises a number of radiation detectors at least corresponding to said number of frequency components.

6. The apparatus of claim 5 wherein each of said radiation detectors is positioned at a location along a line forming a predetermined scattering angle with respect to said line of incidence for generating a signal proportional to said differing intensity at said location.

7. The apparatus of claim 6 wherein each of said number of radiation detectors is located at a different angular location corresponding to a local extremum of the angular scattering spectrum for the frequency to which that one of said radiation detection means is sensitive.

8. The apparatus of claim 7 wherein each of said selected scattering angles is at a local maximum of a respective angular scattering spectrum.

9. The apparatus of claim 7 wherein each of said selected scattering angles is at a local minimum of a respective angular scattering spectrum.

10. The apparatus of claim 7 wherein there are two radiation detectors corresponding to said local extremum, on either side of said local extremum, for detecting at least one of (a) angular shifts in said angular scattering spectrum, and (b) changes in magnitude of said extremum.

11. The apparatus of claim 1 wherein said at least one radiation detection means comprises one radiation detector capable of simultaneous operation at all of said number of frequency components.

12. The apparatus of claim 11 wherein said radiation detector is positioned at a location along a line forming a predetermined scattering angle with respect to said line of incidence for generating signals proportional to said differing intensities of said frequency components at said location.

13. The apparatus of claim 12 wherein said scattering angle is selected such that differences in said components of said object from said predetermined values will produce changes in the output of the detector that can be observed.

14. The apparatus of claim 13 wherein said selected scattering angle is at a local maximum of said angular scattering spectra.

15. The apparatus of claim 13 wherein said selected scattering angle is at a local minimum of said angular scattering spectra.

16. The apparatus of claim 1 wherein said selected frequency range is from about 25 GHz to about 100 GHz.

17. The apparatus of claim 1 wherein said object is a tobacco rod and said components of said object are moisture content and density.

18. The apparatus of claim 17 wherein said tobacco rod is a cigarette rod on a cigarette making machine.

19. The apparatus of claim 17 wherein said frequency components are about 25 GHz and about 100 GHz.

20. The apparatus of claim 17 further comprising means responsive to said indicating means for modifying the amount of at least one of (a) tobacco in said cigarette rod, and (b) moisture in said tobacco.

21. The apparatus of claim 1 wherein said indicating means comprises means for generating a signal based on a ratio of respective differing intensity signals for each of said frequency components.

22. A method for monitoring two components of an object, said object having a dielectric constant, each of said components contributing to said dielectric constant, the contribution of one of said components to said dielectric constant varying substantially over a selected frequency range and the contribution of the other of said components being substantially constant over said selected frequency range, said method comprising the steps of:

directing a beam of electromagnetic radiation linearly polarized in a predetermined direction along a predetermined line of incidence toward said object, said beam of electromagnetic radiation comprising at least two frequency components within said selected frequency range; wherein:

said object scatters said beam of radiation through reflection, interference and refraction as a function of scattering angle, the intensity of scattered radiation forming an angular scattering intensity spectrum for each of said frequency components, each of said spectra varying between localized maxima and minima as a function of scattering angle; said method further comprising:

detecting the angular scattering intensity spectra and generating signals relating to the intensity of radiation scattered from said object at each of said frequency components and polarized only in a direction parallel to said predetermined direction, said signals being characteristic of said angular scattering intensity spectra for radiation polarized in said predetermined direction at said frequencies, such that said generated signals would be known intensity signals if said components of said object were present at predetermined levels, said generated signals having intensities differing from said known intensities when said components of said object differ from said predetermined levels; and indicating deviation of the level of each of said components of said object from each said predetermined level based on said differing intensity signal for each of said frequency components and to relative amounts by which each of said differing intensity signals differs from its corresponding known intensity signal, thereby indicating the level of each of said components of said object.

23. The method of claim 22, wherein said beam of electromagnetic radiation comprises two frequency components.

24. The method of claim 22 comprising detecting said radiation at a location along a line forming a predetermined scattering angle with respect to said line of incidence for generating a signal proportional to said differing intensity at said location.

25. The method of claim 24 wherein said scattering angle is selected such that differences in said components of said object from said predetermined values will produce changes that can be observed.

26. The method of claim 24 wherein said location corresponds to a local extremum of the angular scattering spectrum of one of said frequency components.

27. The method of claim 26 wherein said location corresponds to a local minimum of said angular scattering spectrum of said one of said frequency components.

28. The method of claim 26 wherein said location corresponds to a local maximum of said angular scattering spectrum of said one of said frequency components.

29. The method of claim 26 comprising detecting said radiation at a second location corresponding to said local extremum, said location and said second location being on either side of said local extremum, for detecting at least one of (a) angular shifts in said angular scattering spectrum and (b) changes in magnitude of said extremum.

30. The method of claim 22 wherein said selected frequency range is from about 25 GHz to about 100 GHz.

31. The method of claim 22 wherein said object is a tobacco rod and said components of said object are moisture content and density.

32. The method of claim 31 wherein said tobacco rod is a cigarette rod on a cigarette making machine.

33. The method of claim 31 further comprising, responsive to said indicating step, modifying the amount of at least one of (a) tobacco in said cigarette rod, and (b) moisture in said tobacco.

34. The method of claim 31 wherein said frequency components are about 25 GHz and about 100 GHz.

35. The method of claim 22 wherein said indicating step comprises generating a signal based on a ratio of respective differing intensity signals for each of said frequency components.

* * * * *